United States Patent
D'Abramo et al.

(10) Patent No.: US 7,327,190 B2
(45) Date of Patent: Feb. 5, 2008

(54) DIFFERENTIAL AMPLIFIER ARRANGEMENT

(75) Inventors: Paolo D'Abramo, Civitavecchia (IT); Riccardo Serventi, Pietrasanta (IT)

(73) Assignee: Austriamicrosystems AG, Unterpremstatten (AT)

( * ) Notice: Subject to any disclaimer, the term of this patent is extended or adjusted under 35 U.S.C. 154(b) by 0 days.

(21) Appl. No.: 10/573,455

(22) PCT Filed: Aug. 24, 2004

(86) PCT No.: PCT/EP2004/009457

§ 371 (c)(1),
(2), (4) Date: Sep. 29, 2006

(87) PCT Pub. No.: WO2005/036733

PCT Pub. Date: Apr. 21, 2005

(65) Prior Publication Data

US 2007/0115047 A1    May 24, 2007

(30) Foreign Application Priority Data

Sep. 26, 2003 (DE) ................. 103 45 100

(51) Int. Cl.
*H03F 1/36* (2006.01)
(52) U.S. Cl. ................. 330/86; 330/9; 330/84
(58) Field of Classification Search .......... 330/86, 330/9, 84, 295, 124 R, 254
See application file for complete search history.

(56) References Cited

U.S. PATENT DOCUMENTS

| | | | |
|---|---|---|---|
| 5,233,309 A | 8/1993 | Spitalny et al. | |
| 6,032,109 A | 2/2000 | Ritmiller, III | |
| 6,104,245 A | 8/2000 | De Jong | |
| 6,459,335 B1 * | 10/2002 | Darmawaskita et al. | 330/9 |
| 6,538,507 B2 * | 3/2003 | Prentice et al. | 330/85 |
| 7,088,179 B2 * | 8/2006 | Gilbert et al. | 330/254 |
| 2001/0048344 A1 | 12/2001 | Isken et al. | |

FOREIGN PATENT DOCUMENTS

| | | |
|---|---|---|
| DE | 101 58 709 | 7/2003 |
| WO | WO03/049282 | 6/2003 |

OTHER PUBLICATIONS

Translation of International Preliminary Examination Report for Application No. PCT/EP2004/009457.

* cited by examiner

*Primary Examiner*—Patricia Nguyen
(74) *Attorney, Agent, or Firm*—Fish & Richardson P.C.

(57) ABSTRACT

Circuitry for use in a differential amplifier includes an input stage having a first differential amplifier and an offset compensation stage that includes at least one controllable current source. The offset compensation stage is connected to a bias input of the first differential amplifier. The circuitry includes an output stage having a second differential amplifier, where the output stage is after an output of the input stage, and a programmable resistor network for controlling an amplification of the input stage. The programmable resistor network controls the amplification in accordance with a feedback from the first differential amplifier.

16 Claims, 3 Drawing Sheets

DIFFERENTIAL AMPLIFIER ARRANGEMENT

TECHNICAL FIELD

This patent application describes a differential amplifier arrangement.

BACKGROUND

High-precision differential amplifiers with selectable amplification are also known as instrumentation amplifiers. Usually, such differential amplifiers must meet the requirement of providing a large modulation range at the output of the amplifier. Amplifiers whose modulation range covers practically the entire interval of the supply voltage with which the amplifier is fed are referred to as rail-to-rail amplifiers.

In particular in the case of such high-precision differential amplifiers, common-mode offsets at the input can cause undesirable signal falsification which has a disadvantageous effect.

SUMMARY

In general, in one aspect, the application is directed to a differential amplifier arrangement comprising:
 an input stage comprising a first differential amplifier, with an offset compensation stage which comprises at least one controllable current source and which is connected to a bias input of the first differential amplifier; and
 an output stage comprising a second differential amplifier, with said output stage being arranged downstream of said input stage.

The proposed principle makes possible precise programming of the offset of the amplifier, and thus also precise correction of an offset which occurs at the input.

In this setup, the differential amplifier arrangement is designed in multi-stages, comprising an input stage and an output stage, each of which comprises a differential amplifier.

Preferably, the differential amplifiers of the input stage and the output stage are interconnected such that a so-called instrumentation amplifier is formed.

Preferably, the differential amplifier of the input stage is a rail-to-rail amplifier.

Preferably, the differential amplifier arrangement is of symmetrical construction, such that differential signals can be processed.

Preferably, the differential amplifier of the input stage comprises negative feedback, for which a feedback branch couples an output of the differential amplifier to an input.

Preferably, the feedback branch comprises a programmable resistor network. In this way, amplification of the input stage can be adjusted or programmed with high precision.

Preferably, the programmable resistor network is a series connection of several resistors, with tappings being provided between the resistors. Preferably, this series connection of the resistors, of which there are several, is connected to the feedback branch of the differential amplifier of the input stage such that depending on the desired amplification, that particular tapping is effectively connected to the feedback, which tapping provides the desired amplification.

Preferably, the output connection of the differential amplifier of the input stage is firmly connected to the series connection of the resistors, of which there are several, while an inverting input of this differential amplifier is switchably connected to a tapping of the programmable resistor network.

Preferably a multiplexer is provided as a switch.

Preferably, the differential amplifier of the input stage comprises two operational amplifiers.

Preferably, each of the two operational amplifiers comprises a non-inverting input and an inverting input. The non-inverting inputs together form a symmetrical signal input of the entire differential amplifier arrangement for supplying a differential signal.

Preferably, the inverting inputs are connected to the respective output of the operational amplifier in a feedback branch each. Preferably, the programmable resistor network is provided in duplicate, and is allocated to each of the two operational amplifiers in the feedback branch.

According to a further preferred improvement of the principle proposed, the bias input of the first differential amplifier is formed both at the inverting input of the first operational amplifier, and at the inverting input of the second operational amplifier.

Preferably, at least one controllable current source each is connected to each inverting input of the two operational amplifiers.

The offset compensation stage preferably comprises a bridge circuit. In this arrangement, two series connections, each with two programmable current sources, are provided, with a tapping node each being formed between them. Each of the two tapping nodes is connected to an inverting input of the two operational amplifiers.

Preferably, the four programmable current sources are programmable concerning the extent of the current supplied by them, and furthermore they are preferably designed so that they can be switched off. To this effect, preferably a series connection each, of a switch and of a programmable current source, is connected between the bias inputs of the two operational amplifiers and a respective supply connection or reference potential connection.

The differential amplifier of the output stage of the amplifier arrangement preferably also comprises means for programming its amplification factor.

To this effect, preferably a negative feedback is provided at the differential amplifier of the output stage, which comprises a programmable resistor. Preferably, the programmable resistor can be set with a digital/analogue converter which is arranged in the feedback branch of the differential amplifier of the output stage.

According to a preferred improvement of the proposed principle, the output stage comprises means for setting a common-mode signal.

For the purpose of setting the common-mode signal, the output stage can comprise several amplifier stages, connected in series, which amplifier stages are interconnected in a common-mode feedback loop.

Preferably, a common-mode level is provided which corresponds to half the supply voltage.

According to the proposed principle, coarse amplification control is preferably carried out in the input stage, while fine adjustment of the amplification factor is carried out in the output stage. Furthermore, the input stage comprises a circuit for offset correction. The output stage further amplifies the signal of the input stage, which signal has already been offset-corrected.

Further details and advantageous embodiments of the proposed principle are provided in the subordinate claims.

Embodiments of the differential amplifier arrangement are described below with reference to the following drawings.

DESCRIPTION OF THE DRAWINGS

The following are shown.

DETAILED DESCRIPTION

Figure 1:
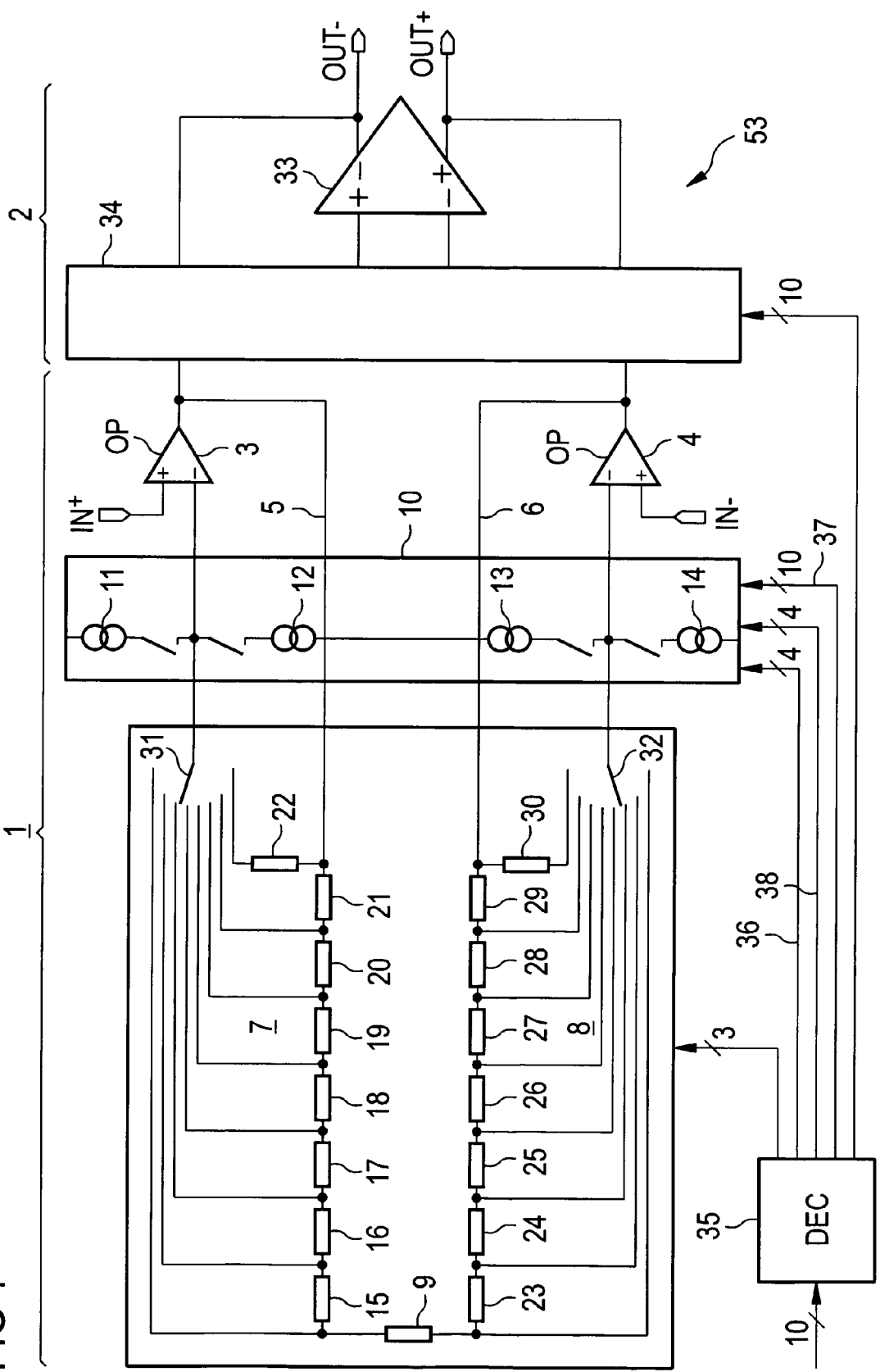
FIG. 1 a functional block diagram of an embodiment of a differential amplifier arrangement according to the proposed principle.

FIG. 1 shows a differential amplifier arrangement comprising an input stage 1 and an output stage 2. The input stage 1 comprises a differential amplifier which comprises two operational amplifiers. In each case, a first operational amplifier 3 and a second operational amplifier 4 are rail-to-rail amplifiers. The non-inverting inputs of the operational amplifiers 3, 4 form a symmetric signal input IN+, In– of the amplifier arrangement. Between the output and the inverting input of the operational amplifiers 3, 4, a feedback branch 5, 6 is provided in each case. Each of the feedback branches 5, 6 comprises a switchable resistor network 7, 8, with said feedback branches 5, 6 in addition being interconnected by way of a shunt resistor 9. Moreover, an offset compensation stage 10 is provided, which is connected to the inverting inputs of the operational amplifiers 3, 4. The offset compensation stage 10 comprises several controllable current sources 11, 12, 13, 14 which are connected, in a way that they can be switched on or off, to the bias inputs of the operational amplifiers 3, 4, with, furthermore, each controllable current source 11, 12, 13, 14 providing a current of a programmable extent. In this way, offsets can be set and corrected as desired. Each of the resistor networks 7, 8 comprises a series connection of a multitude of resistors 15, 16, 17, 18, 19, 20, 21, 22, 23, 24, 25, 26, 27, 28, 29, 30. Resistors 9, and 15 to 30, are interconnected in a single resistor chain. The resistors 15 to 22 of the first resistor network 7 comprise tappings at their connection nodes, with said tappings leading to a multiplexer 31 which switchably connects one of the tappings to the bias input, i.e. to the inverting input of the operational amplifier 3. The tapping between the resistors 21, 22 of the resistor chain is firmly connected to the output of the operational amplifier 3. The resistor network 8 is constructed analogous to this; it comprises a multiplexer 32 which switchably connects one of the tappings of the resistor chain 23 to 30 to the inverting input of the operational amplifier 4. The output of the operational amplifier 4 is connected to the tapping between the resistors 29, 30. The resistor 9, which is a shunt resistor, interconnects one connection each of the resistors 15, 23 of the resistor networks 7, 8.

Figure 3:
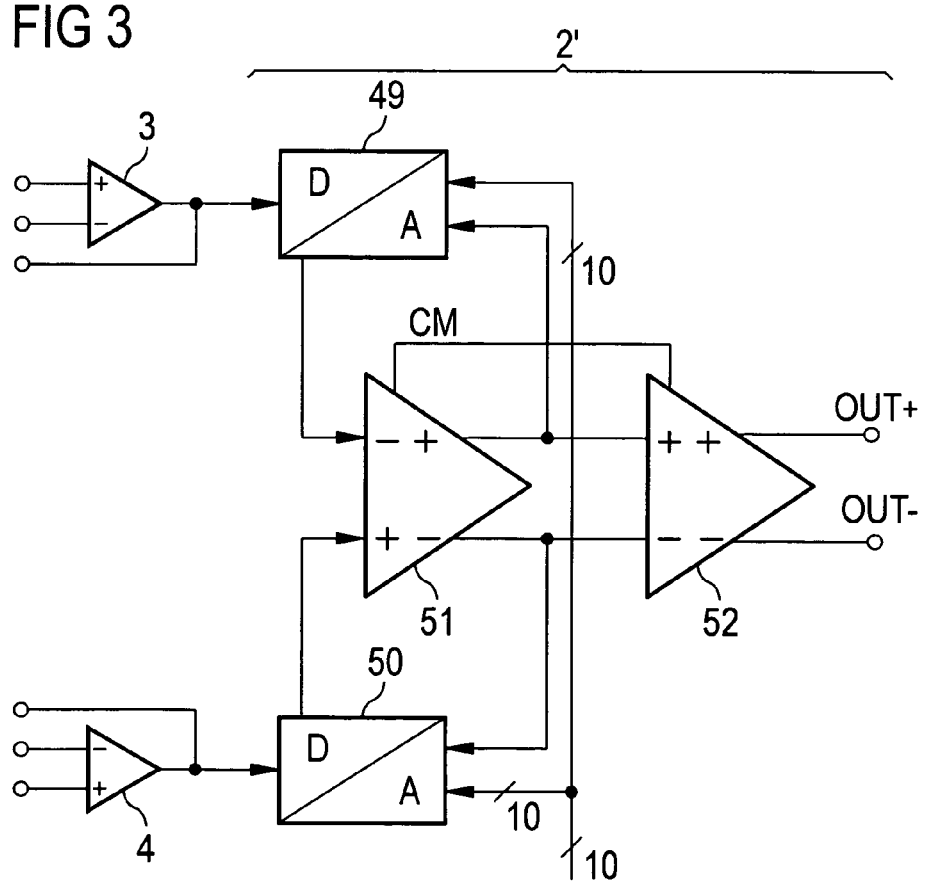
FIG. 3 an exemplary embodiment of the output stage of a differential amplifier arrangement according to the proposed principle.

The output stage 2 comprises a differential amplifier 33 which has a differential input and a differential output. The differential output of the second differential amplifier 33 is coupled to a symmetric signal output OUT+, OUT– of the entire differential amplifier arrangement. Furthermore, a coupling unit 34, explained in detail with reference to FIG. 3, is provided which on the input side interconnects the outputs of the operational amplifiers 3, 4 of the input stage, and on the output side interconnects the inputs of the differential amplifier 33 as well as its outputs in a programmable, negative feedback.

The resistor networks 7, 8 as well as the coupling unit 34 are programmable. To this purpose, control inputs are provided which connect the multiplexers 31, 32 as well as the coupling unit 34 to outputs of a decoder 35. The decoder 35 converts a desired amplification signal which is present on the input side, and via a 3-bit wide data bus controls the multiplexers 31, 32 to provide a coarse amplification setting. Fine setting of the amplification takes place by way of a further data bus, which is 10 bits wide, which links an output of the decoder 35 to the coupling unit 34. A range of 1 to 200 can be set with the 3-bit amplifier coarse setting. Fine adjustment of the amplification is in a high-resolution settings range from 1 to 2047.

A further control bus 36, which is 4 bits wide, is used for coarse adjustment of the input offset of the amplifier; it can over a range of +/–400 mV/V relative to the supply voltage. Fine adjustment of the input offset of the amplifier is ensured with a further data bus 37, 10 bits wide, which also connects an output of the decoder 35 with the offset compensation stage 10. Furthermore, a control bus 38, 4 bits wide, is provided, which makes it possible to set the offset compensation function. The decoder 35 comprises a 10-bit wide input for the supply of amplification and offset control signals. Furthermore, a control input, not shown in FIG. 1, is provided for activating programming of the data bus. The decoder 35 comprises internal memory registers for storing the current programming of all the above-mentioned control buses and data buses.

If coarse adjustment of the offset compensation is not required, it can be deactivated by means of another control line which is 1 bit wide. In this way, a significant reduction in the current uptake of the entire arrangement is possible.

The described differential amplifier arrangement combines the advantages of a wide input range, wide modulation range, fine resolution, good linearity and precise offset correction.

Figure 2:
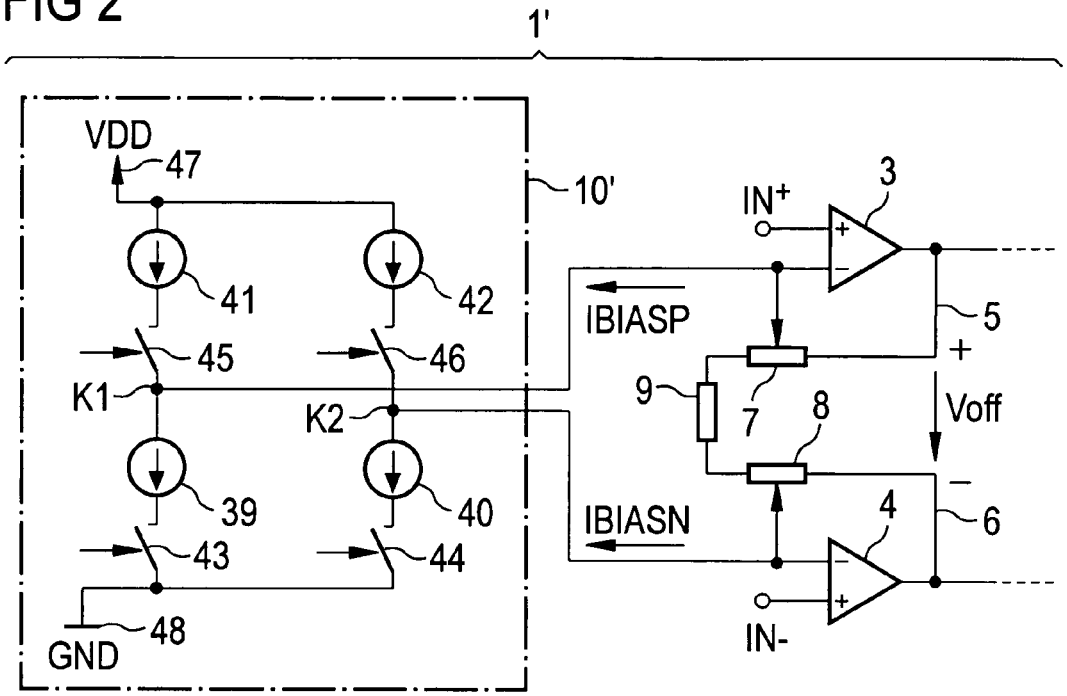
FIG. 2 an exemplary embodiment of the input stage of a differential amplifier arrangement according to the proposed principle.

FIG. 2 shows an embodiment of the input stage 1' of a differential amplifier arrangement according to the proposed principle. In this arrangement, the offset compensation stage 10', which is connected to the bias connections of the operational amplifiers 3, 4, comprises a current bridge circuit. The bridge circuit comprises a total of four programmable current sources 39, 40, 41, 42, each of which is arranged connected in series with a switch 43, 44, 45, 46 between a first tapping node K1 and supply potential or reference potential 47, 48, as well as being arranged between a second tapping node K2 and supply potential or reference potential 47, 48. By means of switches 43 to 46, the current sources 39 to 42 can be switched on and off individually and independently of each other. Furthermore, the respective extent of the bias currents provided by the current sources 39 to 42 is programmable independently of the extent of other bias currents.

Each of the tapping nodes K1, K2 of the current mirror bridge of the offset compensation stage 10' is connected to inverting inputs of the operational amplifiers 3, 4 of the input stage 1. The feedback paths 5, 6 on the operational amplifiers 3, 4, including the programmable resistor networks 7, 8 which in FIG. 2 are only diagrammatically shown, as well as the shunt resistor 9 are of the same design and advantageous function as those shown in FIG. 1. They are therefore not described again here.

Programming of the extent of currents of the current sources 39 to 42 can for example take place by means of suitable digital/analogue converters, depending on the coarse and fine offset control signals supplied by the decoder 35.

FIG. 3 shows an embodiment of the output stage 2', which can for example be used instead of the output stage 2 shown in FIG. 1. A digital/analogue converter 49, 50 each is connected to outputs of the operational amplifiers 3, 4 of the input stage 1, with each of said digital/analogue converters being driven by the control bus which is 10 bits wide and which controls fine adjustment of the amplification of the differential amplifier arrangement. The inverting input of a differential amplifier 51 of fully differential construction is connected to an output of the digital/analogue converter 49, while the non-inverting input of said differential amplifier 51 is connected to an output of the digital/analog converter 50. In a negative feedback, the differential output of the second differential amplifier 51 is connected to a further input of the digital/analogue converters 49, 50. A further differential amplifier 52 is connected to the output of the differential amplifier 51, with the two differential amplifiers 51, 52 being connected in a common-mode feedback loop. In this way, a common-mode signal is controllably set at the output of the differential amplifier arrangement. Preferably, the common-mode modulation corresponds to half the supply voltage.

Figure 4:
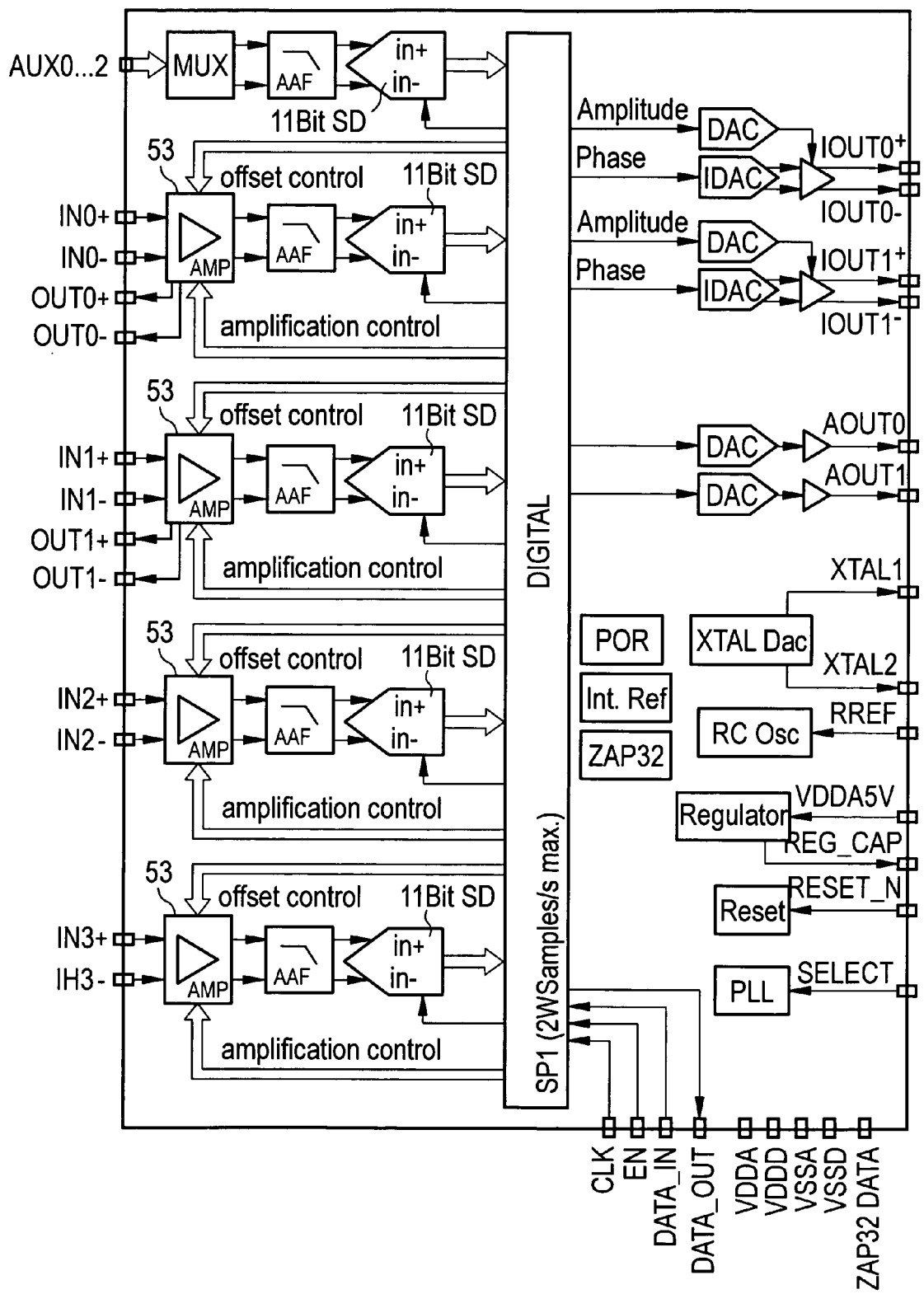
FIG. 4 an exemplary embodiment of a functional block diagram of a universal analogue front end in which several differential amplifier arrangements according to the proposed principle are provided on analogue signal inputs.

FIG. 4 shows an application example of an amplifier arrangement 53 according to the proposed principle, with reference to an exemplary functional block diagram. A total of four analogue signal inputs are provided, with, in each case, an amplifier arrangement 53 as shown in FIG. 1 being connected to said signal inputs.

The invention claimed is:

1. Circuitry for use in a differential amplifier, comprising:
an input stage comprising:
a first differential amplifier; and
an offset compensation stage comprising at least one controllable current source, the offset compensation stage being connected to a bias input of the first differential amplifier;
an output stage comprising a second differential amplifier, the output stage being located after an output of the input stage; and
a programmable resistor network for controlling an amplification of the input stage, the programmable resistor network controlling the amplification in accordance with a feedback from the first differential amplifier.

2. The circuitry of claim 1, wherein the programmable resistor network comprises resistors connected in series with taps between resistors;
wherein one or more resistors are switchable, via the taps, into a feedback path associated with the first differential amplifier in order to control the amplification.

3. The circuitry of claim 1, wherein the first differential amplifier comprises a first operational amplifier and a second operational amplifier;
wherein non-inverting inputs of the first operational amplifier and a second operational amplifier form a symmetric signal input for the first differential amplifier; and
wherein outputs of the first operational amplifier and the second operational amplifier are connected in a feedback path that is connectable to respective inverting inputs of the first operational amplifier and the second operational amplifier.

4. The circuitry of claim 3, wherein the first differential amplifier comprises bias inputs, the bias inputs of the first differential amplifier comprising the inverting input of the first operational amplifier and the inverting input of the second operational amplifier.

5. The circuitry of claim 4, wherein the offset compensation stage comprises a bridge circuit, the bridge circuit comprising programmable current sources; and
wherein current taps from connections to the current sources are connected to the bias inputs of the first operational amplifier and the second operational amplifier.

6. The circuitry of claim 5, wherein each of the programmable current sources is coupled to a bias input of a corresponding operational amplifier such that each programmable current source can be turned on or off independently.

7. The circuitry of claim 1, wherein the second differential amplifier comprises a negative feedback with a programmable resistor which enables an amplification of the output stage to be programmed.

8. The circuitry of claim 5, wherein the programmable current sources comprise four programmable current sources.

9. The circuitry of claim 8, wherein the four programmable current sources comprise two first current sources connected in series and two second current sources connected in series, the two first current sources and the two second current sources being connected in parallel.

10. The circuitry of claim 9, wherein the current taps comprise a first current tap between the two first current sources and a second current tap between the two second current sources.

11. The circuitry of claim 10, wherein the first current tap connects to the bias input of the first operational amplifier, and the second current tap connects to the bias input of the second operational amplifier.

12. The circuitry of claim 2, wherein the first differential amplifier comprises a first operational amplifier and a second operational amplifier;
wherein non-inverting inputs of the first operational amplifier and a second operational amplifier form a symmetric signal input for the first differential amplifier; and
wherein outputs of the first operational amplifier and the second operational amplifier are connected in a feedback path that is connectable to respective inverting inputs of the first operational amplifier and the second operational amplifier.

13. The circuitry of claim 12, wherein the first differential amplifier comprises bias inputs, the bias inputs of the first differential amplifier comprising the inverting input of the first operational amplifier and the inverting input of the second operational amplifier.

14. The circuitry of claim 13, wherein the offset compensation stage comprises a bridge circuit, the bridge circuit comprising programmable current sources; and
   wherein current taps from connections to the current sources are connected to the bias inputs of the first operational amplifier and the second operational amplifier.

15. The circuitry of claim 14, wherein each of the programmable current sources is coupled to a bias input of a corresponding operational amplifier such that each programmable current source can be turned on or off independently.

16. The circuitry of claim 15, wherein the second differential amplifier comprises a negative feedback with a programmable resistor which enables an amplification of the output stage to be programmed.

* * * * *